United States Patent
Kawasaki et al.

(10) Patent No.: US 10,147,695 B2
(45) Date of Patent: *Dec. 4, 2018

(54) CU CORE BALL

(71) Applicant: Senju Metal Industry Co., Ltd., Tokyo (JP)

(72) Inventors: Hiroyoshi Kawasaki, Tochigi (JP); Tomohiko Hashimoto, Tochigi (JP); Atsushi Ikeda, Tochigi (JP); Takahiro Roppongi, Tochigi (JP); Daisuke Soma, Tochigi (JP); Isamu Sato, Saitama (JP); Yuji Kawamata, Tochigi (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/899,378

(22) PCT Filed: Jun. 19, 2013

(86) PCT No.: PCT/JP2013/066827
§ 371 (c)(1),
(2) Date: Dec. 17, 2015

(87) PCT Pub. No.: WO2014/203348
PCT Pub. Date: Dec. 24, 2014

(65) Prior Publication Data
US 2016/0148885 A1    May 26, 2016

(51) Int. Cl.
*H01L 23/00* (2006.01)
*B23K 35/26* (2006.01)
(Continued)

(52) U.S. Cl.
CPC .............. *H01L 24/13* (2013.01); *B22F 1/025* (2013.01); *B23K 35/0244* (2013.01);
(Continued)

(58) Field of Classification Search
CPC .. B23K 35/302; B23K 35/0244; B23K 35/26; H01L 24/13
(Continued)

(56) References Cited

U.S. PATENT DOCUMENTS 9,668,358 B2 *   5/2017   Kawasaki ............ H05K 3/3484
2001/0028109 A1  10/2001  Shimizu et al.
(Continued)

FOREIGN PATENT DOCUMENTS

JP    WO 9524113 A1 *  9/1995  ............ B22F 1/0048
JP    2001237259 A      8/2001
(Continued)

*Primary Examiner* — Weiping Zhu
(74) *Attorney, Agent, or Firm* — The Webb Law Firm

(57) ABSTRACT

A Cu core ball is provided that prevents any soft errors and decreases any connection failure. The Cu core ball includes a solder plating film formed on the surface of a Cu ball that is a Sn solder plating film or is made of a lead-free solder alloy, a principal ingredient of which is Sn. The solder plating film contains U of 5 ppb or less and Th of 5 ppb or less. The Cu ball has a purity of not less than 99.9% Cu and not more than 99.995% Cu. Pb and/or Bi contents therein are at a total of 1 ppm or more. The sphericity thereof is 0.95 or more. The obtained Cu core ball has an α dose of 0.0200 $cph/cm^2$ or less.

8 Claims, 2 Drawing Sheets

(51) Int. Cl.
  *C22C 13/00* (2006.01)
  *H01L 23/556* (2006.01)
  *B22F 1/02* (2006.01)
  *H01L 23/498* (2006.01)
  *B23K 35/02* (2006.01)
  *B23K 35/30* (2006.01)
  *C22C 9/00* (2006.01)
  *C22C 43/00* (2006.01)
  *C23C 28/02* (2006.01)
  *H05K 3/34* (2006.01)

(52) U.S. Cl.
  CPC ............ *B23K 35/26* (2013.01); *B23K 35/262* (2013.01); *B23K 35/30* (2013.01); *B23K 35/302* (2013.01); *C22C 9/00* (2013.01); *C22C 13/00* (2013.01); *C22C 43/00* (2013.01); *C23C 28/021* (2013.01); *H01L 23/49816* (2013.01); *H01L 23/556* (2013.01); *H01L 24/11* (2013.01); *H01L 24/14* (2013.01); *H01L 2224/111* (2013.01); *H01L 2224/1112* (2013.01); *H01L 2224/13014* (2013.01); *H01L 2224/13016* (2013.01); *H01L 2224/13111* (2013.01); *H01L 2224/13147* (2013.01); *H01L 2224/13347* (2013.01); *H01L 2224/13411* (2013.01); *H01L 2224/13611* (2013.01); *H01L 2224/13655* (2013.01); *H01L 2224/13657* (2013.01); *H01L 2224/16145* (2013.01); *H01L 2224/16227* (2013.01); *H01L 2924/1434* (2013.01); *H01L 2924/3841* (2013.01); *H05K 3/3457* (2013.01); *H05K 2203/041* (2013.01)

(58) Field of Classification Search
  USPC .......................................................... 148/24
  See application file for complete search history.

(56) References Cited

U.S. PATENT DOCUMENTS

| | | |
|---|---|---|
| 2003/0224197 A1 | 12/2003 | Soga et al. |
| 2009/0098012 A1 | 4/2009 | Shindo et al. |
| 2014/0010705 A1* | 1/2014 | Kanou ............ C22C 9/00 420/491 |

FOREIGN PATENT DOCUMENTS

| | | | |
|---|---|---|---|
| JP | 2003260587 A | * | 9/2003 |
| JP | 2005002428 A | | 1/2005 |
| JP | 2005036301 A | | 2/2005 |
| JP | 4472752 B2 | | 6/2010 |
| JP | 2011029395 A | | 2/2011 |
| JP | 2011206815 A | | 10/2011 |
| JP | 2011214061 A | | 10/2011 |
| WO | 9524113 A1 | | 9/1995 |
| WO | 2007004394 A1 | | 1/2007 |
| WO | 2012120982 A1 | | 9/2012 |

* cited by examiner

CU CORE BALL

This application is the United States national phase of International Application No. PCT/JP2013/066827 filed Jun. 19, 2013, the disclosure of which is hereby incorporated in its entirety by reference.

TECHNICAL FIELD

The present invention relates to a Cu core ball having less α dose.

BACKGROUND

Development of small information equipment has rapidly advanced miniaturization of its electronic components mounted thereon in recent years. Ball grid array (hereinafter, referred to as "BGA") in which electrodes are arranged on a rear surface of the electronic component has been applied to the electronic components in order to cope with narrowing of the terminals and/or reduced size of mounting area according to downsizing requirement.

As the electronic component to which BGA is applied, a semiconductor package is exemplified. In the semiconductor package, a semiconductor chip having electrodes is sealed by any resins. On the electrodes of the semiconductor chip, solder bumps are formed. Each solder bump is formed by connecting a solder ball with the electrode of the semiconductor chip. The semiconductor package to which BGA is applied is mounted on a printed circuit board by connecting the solder bump fused by heating with conductive land of the printed circuit board. Further, in order to cope with any higher density mounting requirement, a three dimensional high density mounting structure in which the semiconductor packages are piled along a height direction thereof has been studied.

However, when BGA is applied to the semiconductor packages on which the three dimensional high density mounting is performed, each solder ball may become flat by weight of the semiconductor packages. If such a case occurs, the solder sticks out of the electrodes, so that the electrodes may be connected to each other, thereby causing a short-circuit therebetween.

Accordingly, a solder bump including a Cu core ball which is connected to an electrode of an electronic component has been studied. The Cu core ball is referred to as a ball in which solder film is formed on a surface of the Cu ball. The solder bump formed using the Cu core ball can support the semiconductor package by the Cu ball which does not melt at a melting point of the solder when mounting the electronic component on the printed circuit board even if the weight of the semiconductor packages is applied to the solder bump. Therefore, it is impossible for the solder bump to become flat by the weight of the semiconductor packages. As a related art, patent document 1 is exemplified.

The patent document 1 discloses an invention of the Cu ball having high sphericity and describes the Cu core ball in which the solder film is formed on the Cu ball. The same document also discloses a Pb—Sn solder, components of which are Pb and Sn, as an example. The same document further discloses methods of forming the film such as a plating method, a fusing method, a brazing method and the like, in which they are methods as equivalent methods. Among them, as the plating method, an electrolytic plating method such as barrel plating is disclosed.

By the way, the miniaturization of electronic components has allowed the high density mounting structure but such high density mounting structure has caused any problem of software errors. These software errors may occur by rewriting contents stored in a memory cell of a semiconductor integrated circuit (hereinafter, referred to as "IC") when entering a ray into the memory cell. It is considered that the α ray radiates by a decay of a radioactive isotope such as U, Th and $^{210}$Po in a solder alloy. Accordingly, a solder material decreasing radioactive isotope content and having less α ray has been developed in recent years. As a related document, for example, patent document 2 is exemplified.

The patent document 2 discloses an invention of a Sn ingot having low α dose and discloses that in order to decrease the α dose, electrolytic refining is not only performed but an adsorbent is also suspended into an electrolyte, so that it adsorbs Pb and/or Bi to decrease the α dose.

Patent Document 1: International Publication No. 95/24113

Patent Document 2: Japanese Patent No. 4472752

A problem of this invention is to provide a Cu core ball that prevents any software errors from occurring and specifically, to provide a Cu core ball that has less α dose. In the patent document 1, however, any problem to decrease the α dose of the Cu core ball has been not considered at all. The same document also discloses only Pb—Sn alloy as the description of the background art about the solder alloy constituting the solder film. The α ray radiates from $^{210}$Po while $^{210}$Pb, which is an isotope of Pb contained in Sn as impurities, is decayed from $^{210}$Po to $^{206}$Pb through $^{210}$Bi and $^{210}$Po. The Pb—Sn solder alloy which is only one alloy disclosed in the same document contains a lot of Pb so that it is considered that $^{210}$Pb which is a radioactive isotope is also contained. Therefore, even if this solder alloy is applied to the solder film of the Cu core ball, it is quite impossible to consider that the Cu core ball disclosed in the patent document 1 indicates low α dose because any problem to decrease α dose is not taken at all into consideration in the same document.

As described above, the patent document 2 discloses that Pb and/or Bi in the Sn ingot are adsorbed to decrease the α dose by removing Pb and Bi from the Sn ingot by the electrolytic refining which is performed under a situation where electrolyte and electrodes are static. The same document, however, does not absolutely disclose that Sn plating is performed on a Cu ball nor disclose that the electrolytic plating is performed under a situation where the Cu ball and electrolyte are dynamic. Further, in the electrolytic refining described in the same document, since electrolytic deposition is limited to a surface along one direction, it is impossible to form a plating film having a uniform film thickness on a small work such as the Cu ball.

Additionally, by the patent document 2, it is impossible to decrease the α dose by only performing the electrolytic deposition of Sn to a plate electrode under a common electrolytic refining because standard electrode potentials of and Bi are near that of Sn. If the electrolytic refining described in the patent document 2 is applied to a formation of plating film on the Cu ball and an adsorbent is suspended into a plating solution to perform a barrel plating, the plating solution and the work are stirred and at the same time, the adsorbent is also stirred. In this case, Pb ions or Bi ions which the adsorbent adsorbs become carrier so that they can be brought into the solder film together with the adsorbent. The solder film into which the adsorbent is brought radiates high α ray. A grain size of the adsorbent is sub-micron order and since it is very small, it is conceivably impossible to separate and collect the adsorbent after the suspension thereof with the plating solution being flown. Therefore, it is difficult to avoid bringing the adsorbent to which Pb and/or Bi is (are) adsorbed into the film.

Moreover, the patent document 1 discloses the Pb—Sn solder alloy but the plating method, the fusing method, the brazing method and the like are disclosed as equivalent methods so that it rather describes to deny decreasing the α dose. The problem of the patent document 1 is to manufacture a Cu core ball having a high sphericity. On the other hand, in order to solve the problem to decrease the α dose, the patent document 2 discloses that Pb is removed from Sn as much as possible by the electrolytic refining. Therefore, a person who has an ordinary skill in the art and knows the patent document 1 does not conceive the problem described in the patent document 2 to decrease the α dose of the Cu core ball. Their solder components are also contrary to each other so that it is conceivable that he requires a process of trial and error over and over again to conceive the problem to decrease the α dose and to conceive the application of Sn series solder among an infinite number of solder alloys instead of Pb—Sn solder alloy constituting the solder film.

Thus, the person who has an ordinary skill in the art could not combine the patent document 1 with the patent document 2. Further, it is very difficult for the person who has an ordinary skill in the art to prepare the plating solution using the Sn ingot having low α dose, which is disclosed in the patent document 2, and to form the Cu core ball by the plating method disclosed in the patent document 1.

Accordingly, when the Cu core ball manufactured by applying the conventional technologies described in the patent documents 1 and 2 is used for forming the joint, there is such a high possibility that radioactive elements presented in the solder film of the Cu core ball are spread over the electrode of the joint and the α ray radiates therefrom. Therefore, even if the conventional technologies are combined, it is impossible to decrease the α dose of the Cu core ball so that it is impossible to avoid any soft errors, which have been a problem newly generated by the higher density mounting requirement.

SUMMARY OF THE INVENTION

The inventors have selected the Cu ball to be used in the Cu core ball. As a result thereof, they have found out that unless a fixed amount of Pb and/or Bi is contained in the Cu ball, the Cu ball has less sphericity and when performing the solder plating, any uniform solder plating on the Cu ball is failed so that the manufactured Cu core ball also has less sphericity.

Next, they have eagerly studied to decrease the α dose of the solder film constituting the Cu core ball, paying attention to that the solder plating film is formed using the plating method. In order to decrease Pb and/or Bi in the plating solution and Po produced by decay of these elements, the inventors have unexpectedly found that when the plating film is formed on the Cu ball with the Cu ball and the plating solution being flown, the elements of Pb, Bi and Po form salts thereof without suspension of the adsorbent. They have found that since these salts are electrically neutral, these elements are not brought into the plating film, so that the α dose of the plating film constituting the Cu core ball is decreased.

Here, this invention will describe as follows:

(1) A Cu core ball contains a Cu ball and a solder plating film that coats a surface of the Cu ball, wherein the solder plating film is an Sn solder plating film or a solder plating film which is made of lead-free solder alloy, a principal ingredient of the lead-free solder alloy being Sn, the solder plating film contains U content of 5 ppb or less and Th content of 5 ppb or less, the Cu ball includes purity of not less than 99.9% through not more than 99.995%, Pb and/or Bi contents including a total of 1 ppm or more and a sphericity of 0.95 or more, and α dose of the Cu core ball is 0.0200 cph/cm$^2$ or less.

Here, the terms, "a principal ingredient of the lead-free solder alloy being Sn" is referred to as "a solder plating film includes Sn, contents of which is 40 mass % or more in relation to mass of the film". Therefore, the solder plating film constituting the invention includes a Sn solder plating film.

(2) In the Cu core ball described in the above-mentioned item (1), the α dose of the Cu core ball is 0.0020 cph/cm$^2$ or less.

(3) In the Cu core ball described in the above-mentioned item (1), the α dose of the Cu core ball is 0.0010 cph/cm$^2$ or less.

(4) In the Cu core ball described in any one of the above-mentioned items (1) through (3), Pb and Bi contents of the Cu core ball include a total of 1 ppm or more.

(5) The Cu core ball described in any one of the above-mentioned items (1) through (4) contains a diameter of 1 μm through 1000 μm.

(6) In the Cu core ball described in any one of the above-mentioned items (1) through (5), the Cu ball is coated by a plating layer which is made of one element or more previously selected from a group consisting of Ni and Co before the Cu ball is coated by the solder plating film.

(7) In the Cu core ball described in any one of the above-mentioned items (1) through (6), a sphericity of the Cue core ball is 0.95 or more.

(8) A solder joint is formed using the Cu core ball according to any one of the above-mentioned items (1) through (7).

DESCRIPTION OF THE INVENTION

Figure 1:
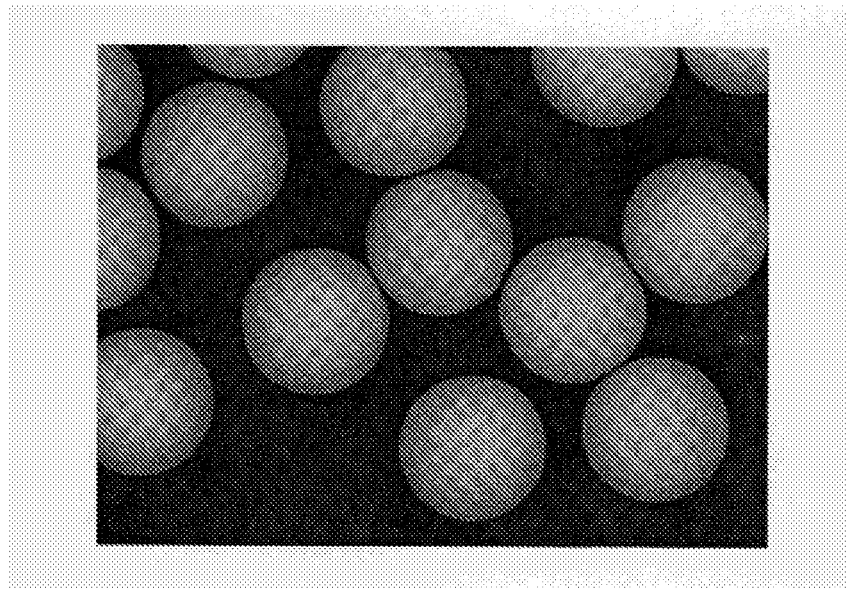
FIG. 1 is a SEM photograph of Cu balls which are manufactured using Cu pellet having a purity of 99.9%.

The following will describe this invention more in detail. In this description, units (such as ppm, ppb and %) relating to composition of the solder film of the Cu core ball represent ratios to mass of the solder film (mass ppm, mass ppb and mass %) unless otherwise specified. Further, units (such as ppm, ppb and %) relating to composition of the Cu ball represent ratios to mass of the Cu ball (mass ppm, mass ppb and mass %) unless otherwise specified.

A Cu core ball according to the invention contains a Cu ball and a solder plating film that coats a surface of the Cu ball. The solder plating film according to the invention is formed by flowing the Cu ball, which is mainly work, and plating solution. The flow of the plating solution allows the elements of Pb, Bi and Po to form salts thereof which are deposited in the plating solution. When any deposit that is a salt is once formed, it stably exists in the plating solution. Therefore, the Cu core ball according to this invention prevents the deposit from being brought into the solder film so that it is possible to decrease contents of radioactive elements contained in the solder film and it is possible to decrease α dose of the Cu core ball itself.

The following will describe the solder plating film and the Cu ball, which are components of the Cu core ball more in detail.

1. Solder Plating Film

Composition of Solder Plating Film

Composition of the solder plating film is not particularly limited when it is an alloy and has an alloy composition of lead-free solder alloy, a principal ingredient of which is Sn. The solder plating film can be an Sn solder plating film. For example, Sn, Sn—Ag alloy, Sn—Cu alloy, Sn—Ag—Cu alloy, Sn—In alloy and alloy to which a given alloy element is added are exemplified. In all of the examples, Sn contents are 40 mass % or more. As the alloy element to be added, for example, Ag, Cu, In, Ni, Co, Sb, Ge, P, Fe and the like are exemplified. Among them, the alloy composition of the solder plating film is preferably Sn-3Ag-0.5Cu alloy from a viewpoint of drop impact resisting characteristic.

Thickness of the solder plating film is not particularly limited, but it is preferably sufficient that the film has 100 μm or less (at one side thereof). Generally, it is sufficient that the film has 20 μm through 50 μm.

U: 5 ppb or less/Th: 5 ppb or less

U and Th are radioactive elements so that it is required to limit their contents in order to suppress any software errors. The U and Th contents are respectively required to be 5 ppb or less so that the α dose of the solder plating film is 0.0200 cph/cm$^2$ or less. Further, preferably, the U and Th contents are respectively 2 ppb or less from a viewpoint of suppressing the software errors in the present or future high density mounting structure.

α dose: 0.0200 cph/cm$^2$ or less

The α dose of the Cu core ball according to this invention is 0.0200 cph/cm$^2$ or less. This is the α dose such that it does not cause any software errors in the high density mounting structure of the electronic components. The α dose of the Cu core ball according to this invention is attained by limiting the α dose of the solder plating film constituting the Cu core ball to be 0.0200 cph/cm$^2$ or less. In this invention, the solder plating film is formed at least at 100 degrees C. so that it is difficult to consider that the contents of radioactive isotopes such as U, Th, $^{210}$Po, Bi, Pb and the like is decreased by vaporization of the radioactive isotopes. However, when plating is performed while the plating solution and the Cu ball are flown, U, Th, Pb, Bi, and $^{210}$Po form salts thereof which are deposited in the plating solution. The deposited salts are electrically neutral and they are not brought into the solder plating film even when the plating solution is flown. Their contents in the solder plating film are considerably decreased. Therefore, the Cu core ball according to the invention represents low α dose because such a solder plating film covers it. From a viewpoint of suppressing any software errors in the higher density mounting structure, it is preferable that the α dose is 0.0020 cph/cm$^2$ or less. It is much preferable that the α dose is 0.0010 cph/cm$^2$ or less.

The higher a purity of the solder plating film constituting the invention has, namely, the smaller the contents of impurities are, the contents of radioactive isotopes are decreased and the α dose is decreased so that the lower limit value of the impurities is not particularly limited. On the other hand, from a viewpoint of decreasing the α dose, it is preferable that the upper limit value thereof is 150 ppm or less. It is much preferable that the upper limit value thereof is 100 ppm or less. It is much more preferable that the upper limit value thereof is 50 ppm or less. It is particularly preferable that the upper limit value thereof is 10 ppm or less.

Further, when the solder plating film is Sn solder, the purity of the solder plating film is represented by total contents of impurities in the solder plating film excluding Sn. When the solder plating film is the solder alloy of Sn-3Ag-0.5Cu, the purity of the solder plating film is represented by total contents of impurities in the solder plating film excluding Sn, Ag and Cu.

As the impurities contained in the solder plating film, Ag, Ni, Pb, Au. U, Th and the like are exemplified in a case of Sn solder plating film. Sb, Fe, As, In, Ni, Pb, Au, U, Th and the like are exemplified in a case of Sn—Ag—Cu alloy. It is particularly preferable that contents of Bi in the impurities are small. Generally, materials of Bi contain a small amount of $^{210}$Bi which is a radioactive isotope thereof. Therefore, by decreasing contents of Bi, it is conceivable that the α dose of the solder plating film can be considerably decreased. It is preferable that the contents of Bi are 15 ppm or less. It is much preferable that the contents of Bi are 15 ppm or less. It is much more preferable that the contents of Bi are 10 ppm or less. It is particularly preferable that the contents of Bi are 0 ppm.

2. Cu Ball

The following will describe the Cu ball constituting this invention more in detail.

The Cu ball constituting this invention can control variation in the height of the solder joint because when the Cu core ball is used for a solder bump, the Cu ball is not fused at a soldering temperature. Therefore, it is preferable that the Cu ball has a high sphericity and a low variation in the diameter thereof. Further, it is preferable that the Cu ball has low α dose like the solder film, as described above. The following will describe preferred embodiment of the Cu ball.

Purity of the Cu ball: not less than 99.9% through not more than 99.995%.

It is preferable that the purity of the Cu ball constituting this invention is not less than 99.9% through not more than 99.995%. When the purity of the Cu ball is within this range, it is possible to keep in the fused Cu a sufficient amount of crystal core for enhancing the sphericity of the Cu ball. The following will describe a reason why the sphericity thereof is enhanced more in detail.

When manufacturing the Cu ball, chips of Cu material each being formed so as to have a predetermined shape are fused by heating them and then, the fused Cu is made spherical by its surface tension. This is then solidified so as to be the Cu ball. During a process from a liquid state of the fused Cu to the solidifying state thereof, the crystal grain grows in the spherically fused Cu. In this moment, when there are many impurity elements, these impurity elements become crystal cores so that they inhibit the crystal grain from growing. Therefore, spherically fused Cu becomes a Cu ball having high sphericity by growth-inhibited and fined crystal grains. On the other hand, when there are few impurity elements, the crystal grain grows with an orientation without inhibiting the crystal grain from growing because there are relatively few crystal cores. As a result thereof, the spherically fused Cu is solidified with a part of the surface thereof being projected. Such a Cu ball has less sphericity. As the impurity elements, Sn, Sb, Bi, Zn, As, Ag, Cd, Ni, Pb, Au, P, S, U, Th and the like are conceivable.

Although a lower limit of the purity is not specifically fixed, it is preferable that this is 99.9% or more, from a viewpoint of controlling the α dose and preventing electroconductivity and/or thermal conductivity of the Cu ball because of less purity thereof from being deteriorated.

Here, while the higher the purity of the solder plating film has, it is possible to decrease the α dose, it is possible to decrease the α dose in the Cu ball even when the purity thereof is not increased more than necessary. Cu has a higher melting point than that of Sn so that that of Cu is higher than heating temperature when manufacturing. In this invention, when manufacturing the Cu ball, radioactive isotopes such as $^{210}$Pb and $^{210}$Bi volatilize because a heating process which has not been performed in the past is performed on Cu materials, which will be described later. On the other hand, when forming the solder plating film using the solder containing Sn as the main component, the solder alloy is heated only up to about 100 degrees C. In the solder plating process, since the above-mentioned radioactive isotopes do not almost volatilize to remain in the plating solution, it is required to decrease concentration of impurities such as Pb and Bi and to increase the purity of the solder plating film.

α dose: 0.0200 cph/cm$^2$ or less.

The α dose of the Cu ball constituting this invention is preferably 0.0200 cph/cm$^2$ or less. This is the α dose such that it does not cause any software errors in the high density mounting structure of the electronic components. In this invention, a heating treatment is again executed in addition to any normal steps to manufacture the Cu ball. Accordingly, $^{210}$Po just remained in Cu raw materials volatilizes and the Cu ball represents lower α dose than that of the Cu raw materials. From a viewpoint of suppressing any software errors in the higher density mounting structure, it is preferable that the α dose is 0.0020 cph/cm$^2$ or less. It is much preferable that the α dose is 0.0010 cph/cm$^2$ or less.

Pb and Bi Contents is a Total of 1 ppm or more:

Although the Cu ball constituting this invention contains, as the impurity elements, Sn, Sb, Bi, Zn, As, Ag, Cd, Ni, Pb, Au, P, S, U, Th and the like, it is preferable that the Cu ball contains particularly Pb and/or Bi of a total of 1 ppm or more. Even if the Cu ball is exposed when forming the solder joint, it is not required in this invention to decrease Pb and/or Bi contents of the Cu ball up to their limits, when decreasing the α dose. This is because of the following reasons:

$^{210}$Pb and $^{210}$Bi change into $^{210}$Po through β-decay. Thus, in order to decrease the α dose, it is preferable that the contents of Pb and Bi as the impurity elements are as little as possible.

However, a content ratio of $^{210}$Pb and $^{210}$Bi contained in Pb and Bi is low. It is conceivable that $^{210}$Pb and $^{210}$Bi are almost removed when a certain amount of Pb and Bi contents is decreased. The Cu ball constituting this invention is manufactured by setting a fusing temperature of Cu at slightly higher temperature than the conventional one or performing heating treatment on the Cu material and/or the granulated Cu ball. Evaporation may be taken place even when this temperature is lower than the boiling point of Pb or Bi, so that the impurity elements decrease. Further, in order to increase the sphericity of the Cu ball, it is desirable to increase the contents of the impurity elements. Therefore, it is preferable that the Cu ball constituting this invention has Pb and/Bi contents of total of 1 ppm or more. When both of Pb and Bi are contained, it has Pb and Bi contents of total of 1 ppm or more.

Thus, since amounts of Pb and/or Bi remain in the Cu ball to some extent after it is manufactured, a measurement error in contents thereof is limited. Further, as described above, since Bi and Pb become crystal cores in fusing time during a manufacturing step of the Cu ball, it is possible to manufacture the Cu ball having high sphericity by adding a given quantity of Bi and Pb. Accordingly, Pb and Bi are important elements for estimating contents of the impurity elements. From such a viewpoint, it is also preferable that the Pb and Bi contents are 1 ppm or more in total. It is very preferable that the Pb and/or Bi contents are 10 ppm or more in total. Although an upper limit thereof is not specifically fixed, it is more preferable that the Pb and Bi contents are less than 1000 ppm in total, from a viewpoint of preventing the electroconductivity of the Cu ball from being deteriorated. It is much more preferable that the Pb and Bi contents are not more than 100 ppm. It is more preferable that the Pb contents are 10 ppm through 50 ppm and it is more preferable that the Bi contents are 10 ppm through 50 ppm.

Sphericity of Cu Ball: 0.95 or More

The Cu ball constituting this invention has the sphericity of 0.95 or more from a viewpoint of controlling the stand-off height. When the sphericity of Cu ball is less than 0.95, the Cu ball has an indeterminate configuration. This causes the bump having uneven height to be formed when forming the bump, so that there may be a strong possibility such that any connection failure occurs. Further, the uneven solder plating is formed on the Cu ball, so that an alignment of the Cu core ball is failed when the Cu core ball is mounted on the electrode and any reflow processing is executed thereon and its self-alignment property also deteriorates. It is more preferable that the sphericity is 0.990 or more. In this invention, a deviation from a complete sphericity of the ball is referred to as the "sphericity". The sphericity is obtained by various kinds of methods such as a least square center (LSC) method, a minimum zone center (MZC) method, a maximum inscribed circle (MIC) method, a minimum circumscribing circle (MCC) method and the like.

Diameter of Cu Ball: 1 μm Through 1000 μm

It is preferable that the Cu ball constituting this invention has a diameter of 1 μm through 1000 μm. When it is within this range, it is possible to manufacture the spherical Cu ball stably and inhibit the terminals from being short-circuited when these terminals are narrow pitch terminals.

Here, when the Cu core ball according to this invention has a diameter of about 1 μm through 300 μm, an aggregation of the Cu core balls may be referred as to "Cu core ball powder". Here, the "Cu core ball powder" is an aggregation of a plurality of the Cu core balls, each Cu core ball having the above properties. For example, it is blended as powder in the solder paste so that it is separated in its use form from single Cu core ball. Similarly, since when it is used for formation of the solder bump, the "Cu core ball powder" used in such a use form is normally treated as any aggregation, the "Cu core ball powder" is separated from the single Cu core ball.

In the Cu core ball according to this invention, a surface of the Cu ball may be previously covered by a plating layer made by other metal before the solder plating film is formed. Particularly, when Ni plating layer, co plating layer or the like is previously covered on the surface of the Cu ball, it is possible to decrease dissolution of Cu to the solder plating film so that it is possible to suppress thinning of Cu in the Cu ball. Further, the metal used for the plating layer is not limited to a single metal element. An alloy in which two elements or more selected among Ni, Co and the like are combined may be used therefor.

It is preferable that the sphericity of the Cu core ball according to the invention is 0.95 or more. When the Cu core ball has low sphericity, an alignment of the Cu core ball is failed when the Cu core ball is mounted on the electrode and any reflow processing is executed thereon and its self-alignment property also deteriorates. It is more preferable that the sphericity is 0.990 or more. Moreover, the Cu core ball according to the invention may be used for a formation of a solder joint which connects terminals on the electronic parts to each other.

The following will describe an example of a method of manufacturing the Cu core ball according to this invention.

The Cu material as material is put on a plate having heat-resisting property (hereinafter, referred to as "heat-resisting plate") such as ceramics and is heated in a furnace together with the heat-resisting plate. There are many dimples each having a hemispheric bottom in the heat-resisting plate. A diameter of the dimple and a depth thereof are suitably set according to a diameter of the Cu ball. For example, the diameter thereof is 0.8 mm and the depth thereof is 0.88 mm. Further, the Cu materials each having a chip shape (hereinafter, referred to as "chip material"), which are obtained by cutting a fine wire made of Cu, are put into the dimples one by one in the heat-resisting plate. The heat-resisting plate in which the chip material have been put into each of the dimples is heated up to 1100 through 1300 degrees C. in the furnace into which ammonia decomposition gas is filled and heating treatment is performed thereon during 30 through 60 minutes. In this moment, when temperature in the furnace is more than the melting point of Cu, the chip material is fused so that it becomes spherical. Thereafter, the interior of the furnace is cooled so that the Cu ball is formed in each of the dimples of the heat-resisting plate. After the cooling, the formed Cu ball is again heated at the temperature of 800 through 1000 degrees C. which is a temperature that is less than the melting point of Cu.

Further, as other methods, there are an atomizing method in which the fused Cu is dropped down from an orifice pierced through a bottom of a melting pot and the droplet is cooled to be granulated as the Cu ball and a granulation method in which thermal plasma heats cut metal of Cu at a temperature of 1000 degrees C. or more. The Cu balls thus granulated may be again heated respectively at a temperature of 800 through 1000 degrees C. during 30 through 60 minutes.

In the methods of manufacturing the Cu core ball according to the invention, the Cu material which is a raw material of the Cu ball may be heated at a temperature of 800 through 1000 degrees C. before the Cu ball is granulated.

As the Cu material which is a raw material of the Cu ball, for example, pellet, wire, pillar or the like can be used. The Cu material may have a purity of 99.9% through 99.99% from a viewpoint such that the purity of the Cu ball does not too decrease.

In a case where the Cu material having a higher purity is used, a temperature for maintaining the fused Cu may decrease to a temperature of about 1000 degrees C., which is similar to a conventional one, without performing the above-mentioned heating treatment. Thus, the above-mentioned heating treatment may be suitably omitted or changed according to the purity of the Cu material and/or the α dose thereof. When manufacturing the Cu balls having high α dose or having no spherical shape, these Cu balls can be reused as a raw material, so that the α dose can be more decreased.

As the method of forming the plating film on the Cu ball by flowing the plating solution with the Cu balls manufactured as described above, there are a electrolytic plating method such as a known barrel plating, a method of generating a high speed turbulent flow in the plating solution within a plating tank by a pump connected to the plating tank and forming the plating film on the Cu ball by the turbulent flow in the plating solution, a method of providing a vibration plate in a plating tank to vibrate it at predetermined frequency so that the plating solution is agitated by high speed turbulent flow and forming the plating film on the Cu ball by the turbulent flow in the plating solution and the like.

The following will describe an example of forming the plating film (film thickness of a single side of which is 20 µm) of Sn—Ag—Cu solder on the Cu ball having a diameter of 100 µm to form the Cu core ball having a diameter of about 140 µm.

A Sn—Ag—Cu containing plating solution according to an embodiment of the invention contains a substance mainly composed of water, sulfonic acids and metal components of Sn, Ag and Cu, as essential components.

The metal components are present in the plating solution as Sn ions ($Sn^{2+}$ and/or $Sn^{4+}$), Ag ions ($Ag^+$), Cu ions ($Cu^+/Cu^+$). The plating solution is obtained by mixing plating mother liquor mainly composed of water and sulfonic acids with metallic compounds and preferably contains organic complex agent in order to stabilize the metal ions.

As the metallic compounds in the plating solution, the following ones are exemplified, for instance.

As specific examples of the Sn compounds, first Sn compounds such as tin salts, tin sulfate, tin oxide, tin nitrate, tin chloride, tin bromide, tin iodide, tin phosphate, tin pyrophosphate, tin acetate, tin formate, tin citrate, tin gluconate, tin tartrate, tin lactate, tin succinate, tin sulfamate, tin borofluoride, tin silicofluoride and the like of organic sulfonic acid such as methanesulfonic acid, ethanesulfonic acid, 2-propanol sulfonic acid, p-phenolsulfonic acid and the like are exemplified. A single species of these Sn compounds can be used or two species or more thereof can be mixed and used.

As the Cu compounds, copper salts, copper sulfate, copper oxide, copper nitrate, copper chloride, copper bromide, copper iodide, copper phosphate, copper pyrophosphate, copper acetate, copper formate, copper citrate, copper gluconate, copper tartrate, copper lactate, copper succinate, copper sulfamate, copper borofluoride, copper silicofluoride and the like of the above-mentioned organic sulfonic acid are exemplified. A single species of these Cu compounds can be used or two species or more thereof can be mixed and used.

As the Ag compounds, silver salts, silver sulfate, silver oxide, silver chloride, silver nitrate, silver bromide, silver iodide, silver phosphate, silver pyrophosphate, silver acetate, silver formate, silver citrate, silver gluconate, silver tartrate, silver lactate, silver succinate, silver sulfamate, silver borofluoride, silver silicofluoride and the like of the above-mentioned organic sulfonic acid are exemplified. A single species of these Ag compounds can be used or two species or more thereof can be mixed and used.

Further, when forming the plating film (film thickness of a single side of which is 20 µm) of Sn—Ag—Cu solder on the Cu ball having a diameter of 100 µm, a quantity of electricity of about 0.0108 coulombs is required.

Blending quantities of respective metals in the plating solution are as follows: As $Sn^{2+}$, 0.21 through 2 mol/L, preferably 0.25 through 1 mol/L; As Ag, 0.01 through 0.1 mol/L, preferably 0.02 through 0.05 mol/L and As Cu, 0.002 through 0.02 mol/L, preferably 0.003 through 0.01 mol/L. Here, since it is $Sn^{2+}$ that relates to the plating, a quantity of $Sn^{2+}$ may be adjusted in this invention.

Moreover, it is preferable that Ag ion concentration to Cu ion concentration (Ag/Cu molar ratio) is within a range of 4.5 through 5.58. If it stays within this range, it is possible to form the plating film of Sn—Ag—Cu such as Sn-3Ag-0.5Cu alloy that has a low melting point.

Further, a desired deposition amount of a solder plating is estimated according to a following formula (1) based on the Faraday's law of electrolysis and an amount of electricity therefor is calculated. The electric current flows through the plating solution so as to be the calculated amount of electricity and the plating is executed while the plating solution flows with the Cu balls. A volume of the plating tank may be fixed according to a total input amount of the Cu balls and the plating solution.

$$w(g)=(1 \times t \times M)/(Z \times F) \quad \text{Formula (1)}$$

In the formula (1), w is an electrolytic deposition amount (g); 1 is electric current (A); t is electricity energizing time (second); M is an atomic weight of a deposited element (in a case of Sn, 118.71); Z is an atomic value (in a case of Sn, bivalent); and F is the Faraday constant (96500 coulombs). The quantity of electricity Q (A·Sec) is represented by 1×t.

Although the plating has been executed in this invention while the plating solution flows with the Cu balls, a flowing method thereof is not particularly limited. For example, the plating solution may flow with the Cu balls by a rotation of barrel like the barrel electrolytic plating method.

After the plating process is executed, any drying is executed in the air or under N2 atmosphere, so that it is possible to obtain the Cu core ball according to the invention.

The invention may be also applied to a column, a pillar or a pellet in which Cu is a core thereof.

EMBODIMENTS

The following will describe embodiments of the invention, but the invention is not limited thereto. In the embodiments, the Cu ball having the high sphericity was manufactured and the solder plating film was formed on the surface of this Cu ball. The α dose thereof was measured.

Embodiment 1

Manufacture of Cu Ball

The manufacture condition of the Cu ball having the high sphericity was searched. Cu pellets each having a purity of 99.9%, Cu wires each having a purity of 99.995% or less and Cu plates each having a purity exceeding 99.995% were prepared. They were respectively put into the melting pot, the temperature of the melting pot was then risen to 1200 degrees C. and this heating treatment was performed during 45 minutes. The fused Cu was dropped down from an orifice pierced through the bottom of the melting pot and the droplet was cooled so as to be granulated as the Cu ball. Thus, the Cu balls having a mean diameter of 250 μm were manufactured. A table 1 shows a result of an elementary analysis and sphericity of the manufactured Cu balls. The following will describe a method of measuring the sphericity more in detail.

Sphericity:

The sphericity was measured by CNC image measurement system. Equipment therefor was ultra quick vision, ULTRA QV350-PRO manufactured by MITSUTOYO Corporation.

Figure 2:
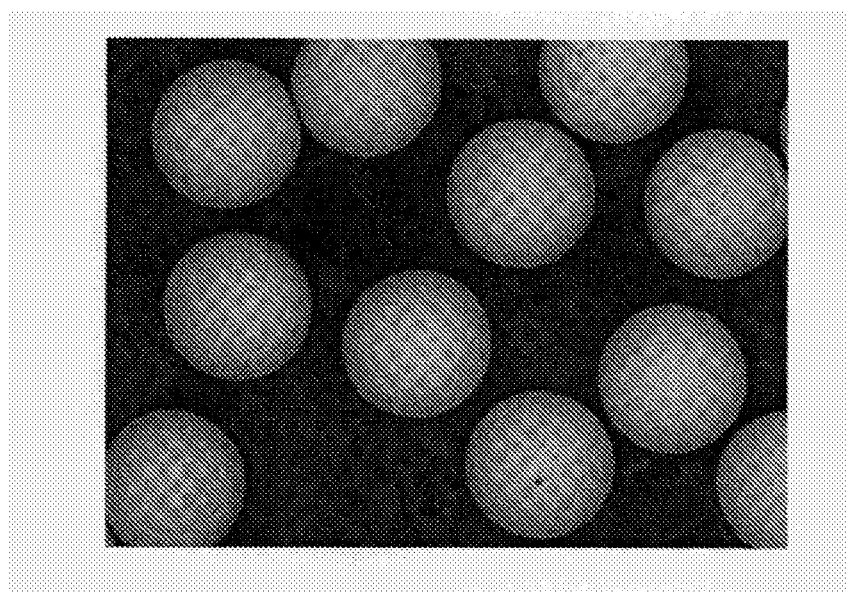
FIG. 2 is a SEM photograph of Cu balls which are manufactured using Cu wire having a purity of 99.995% or less.
Figure 3:
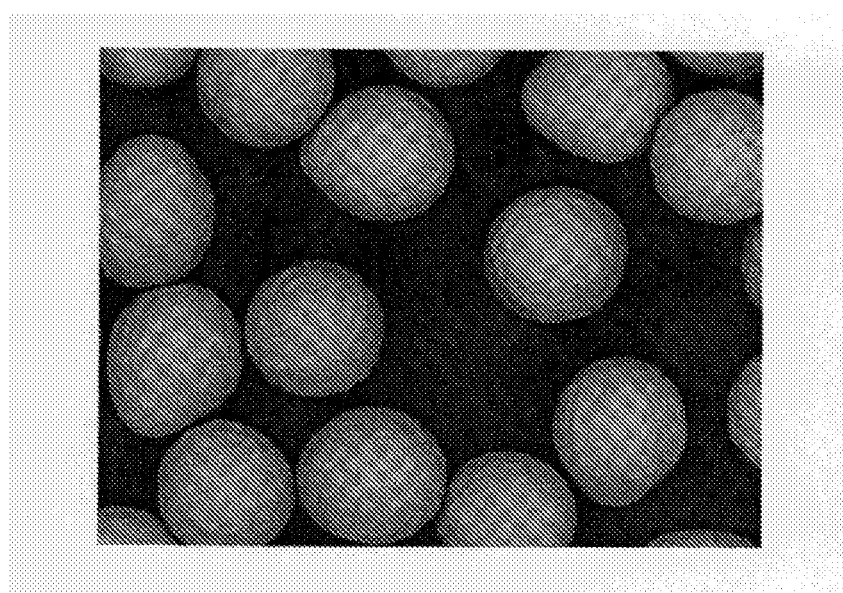
FIG. 3 is a SEM photograph of Cu balls which are manufactured using Cu plate having a purity exceeding 99.995%.

SEM photographs of the manufactured Cu balls are respectively shown in FIGS. 1 through 3. FIG. 1 shows SEM photograph of the Cu balls which were manufactured using the Cu pellets each having a purity of 99.9%. FIG. 2 shows SEM photograph of the Cu balls which were manufactured using the Cu wires each having a purity of 99.995% or less. FIG. 3 shows SEM photograph of the Cu balls which were manufactured using the Cu plates each having a purity exceeding 99.995%. The magnification of each of the SEM photographs is 100 times.

The following will describe the measuring method of the α dose.

α Dose:

The α dose was measured using α dose measurement equipment of a gas flow type proportional counter. A measurement sample was a 300×300 mm flat shallow container with the Cu balls spreading all over it. This measurement sample was put into the α dose measurement equipment and the α dose was measured after it stood for 24 hours under PR-10 gas flow.

Further, the PR-10 gas (90% of argon and 10% of methane) used in the measurement was the gas after more than three weeks was elapsed since the gas was filled in a gas bomb. It complied with a guideline of the method of measuring the α dose, which was prescribed by joint electron device engineering council (JEDEC), that the bomb was used after more than three weeks was elapsed, so that a ray did not occur by radon in the atmosphere, which might be inserted into the gas bomb.

The result of the elementary analysis and the α dose of the manufactured Cu balls is shown in the Table 1.

TABLE 1

| | Cu BALL COMPOSITION | | | | | | | | | | | | | | α DOSE OF Cu BALL | |
|---|---|---|---|---|---|---|---|---|---|---|---|---|---|---|---|---|
| | Cu | Sn | Sb | Bi | Zn | As | Ag | Cd | Ni | Pb | Au | P | S | U | Th | (cph/cm$^2$) | SPHERICITY |
| Cu BALL USING Cu PELLETS EACH HAVING PURITY OF 99.9% | bal. | 84 | 21 | 32 | 3 | 49 | 20 | 7 | 4 | 16 | 4 | 200 | 18 | 1.5 | <0.5 | <0.0010 | 0.9932 |
| Cu BALL USING Cu WIRES EACH HAVING PURITY OF 99.995% OR LESS | bal. | 8 | 10 | 19 | — | 24 | 13 | — | 1 | 8 | — | — | — | <0.5 | <0.5 | <0.0010 | 0.9931 |
| Cu BALL USING Cu PLATES EACH HAVING PURITY EXCEEDING 99.995% | bal. | 13 | 2 | 18 | — | 10 | — | — | 1 | 3 | — | — | — | 0.9 | <0.5 | <0.0010 | 0.9227 |

*U and Th are represented by mall ppb and other elements are represented by mass ppm.

As shown in the Table 1 and FIGS. 1 and 2, both of the Cu balls using the Cu pellets each having a purity of 99.9% and the Cu balls using the Cu wires each having a purity of 99.995% or less showed the sphericity of 0.990 or more. On the other hand, as shown in the Table 1 and FIG. 3, the Cu balls using the Cu plates each having a purity exceeding 99.995% showed the sphericity below 0.95. Accordingly, in all of the following executed examples and comparison example, the Cu core balls were manufactured using the Cu balls which were manufactured using the Cu pellets each having a purity of 99.9%.

Executed Example 1

The Sn solder plating film was formed on each of the Cu balls, which had been manufactured using the Cu pellets each having a purity of 99.9%, under the following conditions to form the Cu core balls.

In each Cu core ball, plating process was executed on the Cu balls having a diameter of 250 μm using the following plating solution as the amount of electricity of about 0.17 coulombs so that the solder plating film of 50 μm was covered (on a single side of the Cu core ball). When observing a section of each of the Cu core balls covered by the solder plating film through the SEM photograph, the film thickness thereof was about 50 μm.

After the process, they were dried in the air and the Cu core balls were obtained.

The solder plating solution was prepared as follows: Full methane sulfonic acid solution of 54 weight % was put into one third of water, which was required to a preparation of the plating solution, within a stirring container and they were put into the stirring container in advance. Next, acetylcysteine which was one example of mercaptan compound that was complexing agent was put thereinto and after its dissolution was confirmed, 2,2'-ditiodianiline which was one example of aromatic amino compound that was other complexing agent was put thereinto. When it was changed to a light blue gelled liquid, stannous trifluoromethanesulfonate was immediately put thereinto. Two third of the water, which was required to a preparation of the plating solution, was then put thereinto and finally, 3 g/L of α-naphthol polyethoxylate (EO10 mol), which was one example of a surfactant, was put thereinto, so that the preparation of the plating solution was completed. Thus, the plating solution indicating that methane sulfonic acid concentration in the plating solution was 2.64 mol/L and tin ion concentration therein was 0.337 mol/L was prepared. The stannous trifluoromethanesulfonate used in this example was prepared by the following sheet member as the raw material thereof.

Elementary analysis of the sheet member which was raw material of the solder plating solution, and elementary analysis of the solder plating film formed on the surface of the Cu core ball were performed by a high-frequency inductively coupled plasma mass spectrometry (ICP-MS analysis) relating to U and Th, and a high-frequency inductively coupled plasma emission spectrometric analysis (ICP-AES analysis) relating to other elements. The α dose of the sheet member was measured similar to the Cu ball except that the sheet member spread over in the 300×300 mm flat shallow container. The α dose of the Cu core ball was measured similar to the above-mentioned Cu ball. Further, the sphericity of the Cu core ball was also measured under the same conditions as those of to the Cu ball. Table 2 shows results of these measurements.

Executed Example 2

The Sn—Ag—Cu solder plating film, the film thickness of a single side of which was 50 μm, was formed on each of the Cu balls, which had been manufactured using the Cu pellets each having a purity of 99.9%, to form the Cu core balls.

In the executed example 2, the solder plating solution was prepared as follows:

Full methane sulfonic acid solution of 54 weight % was put into one third of water, which was required to a preparation of the plating solution, within a stirring container and they were put into the stirring container in advance. Next, a necessary amount of full silver oxide was put thereinto with stirring them, full cupric hydroxide was immediately put thereinto and completely dissolved after its complete transparency without any black deposit was confirmed, acetylcysteine which was one example of mercaptan compound that was complexing agent was put thereinto, and after its dissolution was confirmed, 2,2'-ditiodianiline which was one example of aromatic amino compound that was other complexing agent was put thereinto. When it was changed to a light blue gelled liquid, stannous trifluoromethanesulfonate was immediately put thereinto. The liquid became yellowish transparent. Two third of the water, which was required to a preparation of the plating solution, was then put thereinto and finally, 3 g/L of α-naphthol polyethoxylate (EO10 mol), which was an example of a surfactant, was put thereinto, so that the preparation of the plating solution was completed. Thus, the plating solution indicating that methane sulfonic acid concentration in the plating solution was 2.64 mol/L, tin ion concentration therein was 0.337 mol/L, copper ion concentration therein was 0.005 mol/L and silver ion concentration therein was 0.0237 mol/L was prepared.

After the plating solution was thus prepared, the plating solution was prepare to form the Cu core ball similar to the executed example 1 except that the Sn sheet member having the α dose of 0.203 cph/cm$^2$, which was used in the executed example 1, the Cu plates each having the α dose less than 0.0010 cph/cm$^2$ and a purity of 6N and Ag chips each having the α dose less than 0.0010 cph/cm$^2$ and a purity of 5N were used. The measurements of the elementary analysis, the α dose and the sphericity thereof were performed. The results of these measurements are shown in Table 2.

In this example, tin ions are derived from the above-mentioned Sn sheet member and silver ions and copper ions are respectively derived from the above-mentioned Ag chips and the Cu plates.

Comparison Example 1

The Cu core balls were manufactured by forming Sn solder film on the Cu ball manufactured using the Cu pellets each having a purity of 99.9% by the fusing method under the following conditions. Specifically, many conical dimples were provided on an aluminum plate, to which it was difficult to perform the soldering, at their predetermined positions. Further, Sn balls each having a diameter of 300 μm was previously manufactured by a well-known atomizing method using the above-mentioned Sn sheet member. The Cu ball and the Sn ball were inserted into each of the dimples provided on the aluminum substrate one by one and the flux was strayed onto them. The aluminum plate was then heated up to 270 degrees C. in a heating furnace and Sn ball was fused. The fused Sn got wet around each Cu ball and its surface tension enabled the Cu ball to be covered. Thus, the Cu core balls of the comparison example 1 were manufactured. The film thickness of the solder film (on a single side thereof) was 50 μm. The elementary analysis, the α dose and the sphericity of the manufactured Cu core ball were measured similar to the executed example 1. Table 2 shows results of these measurements.

TABLE 2

| | SOLDER FILM COMPOSITION | | | | | | | | | | | | | | | | α DOSE OF Cu CORE BALL (cph/cm²) | SPHERICITY OF Cu DOSE BALL |
|---|---|---|---|---|---|---|---|---|---|---|---|---|---|---|---|---|---|---|
| | Sn | Sb | Cu | Bi | Zn | Fe | Al | As | Ag | In | Cd | Ni | Pb | Au | U | Th | | |
| EXECUTED EXAMPLE 1 | bal. | 0 | 0 | 0 | 0 | 0 | 0 | 0 | 1 | 0 | 0 | 4 | 3 | 1 | <0.2 | <0.2 | <0.0010 | 0.9925 |
| EXECUTED EXAMPLE 2 | bal. | 3 | 2900 | 0 | 0 | 4 | 0 | 10 | 29500 | 2 | 0 | 15 | 12 | 0 | <0.2 | <0.2 | <0.0010 | 0.9938 |
| COMPARISON EXAMPLE 1 | bal. | 12 | 0 | 18 | 0 | 5 | 0 | 23 | 7 | 11 | 0 | 30 | 46 | 1 | <0.2 | <0.2 | 0.183 | 0.9868 |
| Sn SHEET MEMBER | bal. | 11 | 0 | 18 | 0 | 5 | 0 | 21 | 6 | 11 | 0 | 30 | 49 | 1 | <0.2 | <0.2 | 0.203 | — |

*U and Th are represented by mall ppb and other elements are represented by mass ppm.

According to the Table 2, in the executed example 1, the α dose represented less than 0.0010 cph/cm². It is proved that in the Cu core ball of the executed example 1, the α dose is decreased by forming the solder plating film using the plating method.

In the executed example 2, the solder α dose in the case where the composition of the solder plating film is Sn-2.95Ag-0.29Cu represented less than 0.0010 cph/cm². It is proved that in the Cu core ball of the executed example 2, like the executed example 1, the α dose is decreased by forming the solder plating film using the plating method.

Further, any increase in the α dose of the Cu core balls manufactured in the executed examples 1 and 2 was not seen even after one year was elapsed since the manufacture thereof.

On the other hand, in the comparison example 1, the α dose represented 0.183 cph/cm² which was the same level as that of the Sn sheet member. Therefore, the Cu core balls of the comparison example 1 did not attain the α dose which was the same level as that could avoid any soft errors.

The invention claimed is:

1. A Cu core ball containing a Cu ball and a solder plating film that coats a surface of the Cu ball, wherein the solder plating film comprises a Sn solder plating film or a solder plating film which is made of lead-free solder alloy, a principal ingredient of the lead-free solder alloy being Sn;
the solder plating film contains U content of 5 ppb or less and Th content of 5 ppb or less;
the Cu ball includes purity of not less than 99.9% Cu and not more than 99.995% Cu; Pb and/or Bi at a total of 1 ppm or more; and a dose of the Cu core ball is 0.0200 cph/cm² or less,
wherein the sphericity of the Cu core ball is 0.95 or more, and
wherein the solder plating film has a thickness of 20-100 µm.

2. The Cu core ball according to claim 1 wherein the α dose of the Cu core ball is 0.0020 cph/cm² or less.

3. The Cu core ball according to claim 1 wherein the α dose of the Cu core ball is 0.0010 cph/cm² or less.

4. The Cu core ball according to claim 1 wherein the Cu core ball comprises both Pb and Bi at a total of 1 ppm or more.

5. The Cu core ball according to claim 1 having a diameter of 1 µm through 1000 µm.

6. The Cu core ball according to claim 1 wherein the Cu ball is coated by a plating layer which is made of one element or more previously selected from a group consisting of Ni and Co before the Cu ball is coated by the solder plating film.

7. A solder joint that is formed using the Cu core ball according to claim 1.

8. The Cu core ball according to claim 1 wherein the Cu ball comprises Pb at a total of 1 ppm or more.

* * * * *

UNITED STATES PATENT AND TRADEMARK OFFICE
CERTIFICATE OF CORRECTION

PATENT NO. : 10,147,695 B2
APPLICATION NO. : 14/899378
DATED : December 4, 2018
INVENTOR(S) : Hiroyoshi Kawasaki et al.

It is certified that error appears in the above-identified patent and that said Letters Patent is hereby corrected as shown below:

In the Claims

Column 16, Line 19, Claim 1, delete "a" and insert -- α --

Signed and Sealed this
Twenty-sixth Day of March, 2019

Andrei Iancu
*Director of the United States Patent and Trademark Office*